United States Patent
Cox et al.

(10) Patent No.: US 7,453,698 B2
(45) Date of Patent: Nov. 18, 2008

(54) APPARATUS AND METHOD FOR AUTOMATICALLY SECURING A CHASSIS TO A RACKMOUNT RAIL

(75) Inventors: Aaron Roger Cox, Tucson, AZ (US); Michael Allen Curnalia, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 257 days.

(21) Appl. No.: 11/467,463

(22) Filed: Aug. 25, 2006

(65) Prior Publication Data

US 2008/0049385 A1 Feb. 28, 2008

(51) Int. Cl.
*H05K 7/16* (2006.01)
(52) U.S. Cl. ...................................... 361/726
(58) Field of Classification Search ................. 361/724, 361/725, 726, 727, 679, 752; 439/79; 313/318.06
See application file for complete search history.

(56) References Cited

U.S. PATENT DOCUMENTS

| | | | | |
|---|---|---|---|---|
| 6,744,625 B2 * | 6/2004 | Syring et al. ................. | 361/685 |
| 6,826,045 B2 * | 11/2004 | Chen ........................... | 361/685 |
| 6,885,550 B1 * | 4/2005 | Williams ..................... | 361/685 |
| 7,218,526 B2 * | 5/2007 | Mayer ......................... | 361/725 |
| 7,318,532 B1 * | 1/2008 | Lee et al. ...................... | 211/26 |
| 2003/0210514 A1 * | 11/2003 | Liu et al. ..................... | 361/683 |
| 2003/0210517 A1 * | 11/2003 | Syring et al. ................. | 361/685 |
| 2005/0094380 A1 * | 5/2005 | Mukougawa ................. | 361/724 |
| 2005/0162838 A1 * | 7/2005 | Mayer ......................... | 361/725 |
| 2007/0115627 A1 * | 5/2007 | Carlisi et al. ................. | 361/686 |

* cited by examiner

*Primary Examiner*—Chandrika Prasad
(74) *Attorney, Agent, or Firm*—Kunzler & McKenzie

(57) ABSTRACT

An apparatus and method to automatically secure a chassis to a rackmount rail. The apparatus includes a pin operably attached to a chassis and an aperture disposed within a rackmount rail to receive the pin. The pin is attached to the chassis such that the pin automatically protrudes from the chassis upon inserting a component into the chassis. The aperture automatically receives the pin to secure the chassis. Removing the component from the chassis automatically disengages the pin from the aperture to release the chassis.

6 Claims, 2 Drawing Sheets

APPARATUS AND METHOD FOR AUTOMATICALLY SECURING A CHASSIS TO A RACKMOUNT RAIL

BACKGROUND OF THE INVENTION

1. Field of the Invention

The invention relates to rack-mounted systems. Specifically, the invention relates to systems and methods for automatically securing a rackmount chassis to a rackmount rail.

2. Description of the Related Art

Electronics racks are commonly used to house sophisticated electronic equipment, such as telecommunications equipment and computer systems. An electronic rack provides a highly modular mounting system that may be customized to accommodate any particular need or electronic component while maintaining electronic equipment in an efficient and orderly manner. An electronics rack thus optimizes electronic equipment storage, maximizing computing power relative to required storage space.

Electronic components are typically housed in a chassis standardized to fit an electronics rack. The chassis may be set on stationary rails within the rack or on slides attached to the rack, and secured by bolts driven through its front panel into vertical rack mounting strips. While this method of attachment may prevent the chassis from sliding off the rails, rotational vibration from system operation may cause vibration frequencies capable of damaging sensitive electronic components.

Tie-down methods exist to further secure the chassis and prevent damage to sensitive electronic components. Screws, for example, may be driven through the chassis and into the rear of the rack's mounting rails. Manually installing such screws, however, is a tedious task that often results in screws being dropped and lost into the rear of the rack. Screw installation is also inefficient as it requires an extra step at install time, as well as an extra tool—a screwdriver. Indeed, a screw used for rear tie-down must recess out of the way so that nearby components can be easily removed and/or installed for service or upgrade. A flat head screw, and a screwdriver for installation and removal, is thus required. The difficulty and inconvenience of the added tools and time necessary to install rear tie-down screws often hinders their use and effectiveness.

While tool-less fasteners are available to facilitate rear tie-down methods, such fasteners tend to obstruct access to internal components. Accordingly, the fasteners must be removed before certain components may be serviced, and replaced following servicing. This both complicates the servicing process and increases the likelihood that the rear tie-down step may be inadvertently overlooked following servicing, rendering internal components vulnerable to damage from vibration frequencies.

From the foregoing discussion, it should be apparent that a need exists for an apparatus and method to automatically secure a rackmount chassis to a rackmount rail while avoiding obstruction of internal chassis components. Beneficially, such an apparatus and method would promote efficient chassis and chassis component installation, facilitate quick and easy component servicing and upgrades, and reliably secure the chassis to the rail. Such an apparatus and method are disclosed and claimed herein.

SUMMARY OF THE INVENTION

The present invention has been developed in response to the present state of the art, and in particular, in response to the problems and needs in the art that have not yet been met for securing a chassis to a rackmount rail. Accordingly, the present invention has been developed to provide an apparatus and method for automatically securing a chassis to a rackmount rail that overcomes many or all of the above-discussed shortcomings in the art.

An apparatus to automatically secure a chassis to a rackmount rail according to the present invention may include a pin attached to the chassis and a mating aperture disposed within a rackmount rail. The pin may be adapted to protrude from the chassis upon inserting a component into the chassis. The aperture may automatically receive the pin to secure the chassis.

In one embodiment, a biasing member operably attaches the pin to the chassis. An access aperture may be disposed within the chassis such that the pin automatically protrudes through the access aperture upon inserting a component into the chassis.

A method of the present invention is also presented for automatically securing a chassis to a rackmount rail. In one embodiment, the method includes operably attaching a pin to a chassis, wherein the pin automatically protrudes from the chassis upon inserting a component into the chassis. The method further includes disposing within a rackmount rail an aperture to receive the pin and secure the chassis.

As in the apparatus, a biasing member may operably attach the pin to the chassis. In some embodiments, the method may further comprise integrating within the chassis an access aperture, wherein the pin automatically protrudes through the access aperture upon inserting the component into the chassis.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

It will be readily understood that the components of the present invention, as generally described and illustrated in the Figures herein, may be arranged and designed in a wide variety of different configurations. Thus, the following more detailed description of the embodiments of the apparatus, system, and method of the present invention, as presented in the Figures, is not intended to limit the scope of the invention, as claimed, but is merely representative of selected embodiments of the invention.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily all referring to the same embodiment.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

As used in this specification, the term "rackmount" refers to equipment designed to fit an industry-standard electronics rack. The term "chassis" refers to a rackmount housing to receive and store one or more electronic components.

Figure 1A:
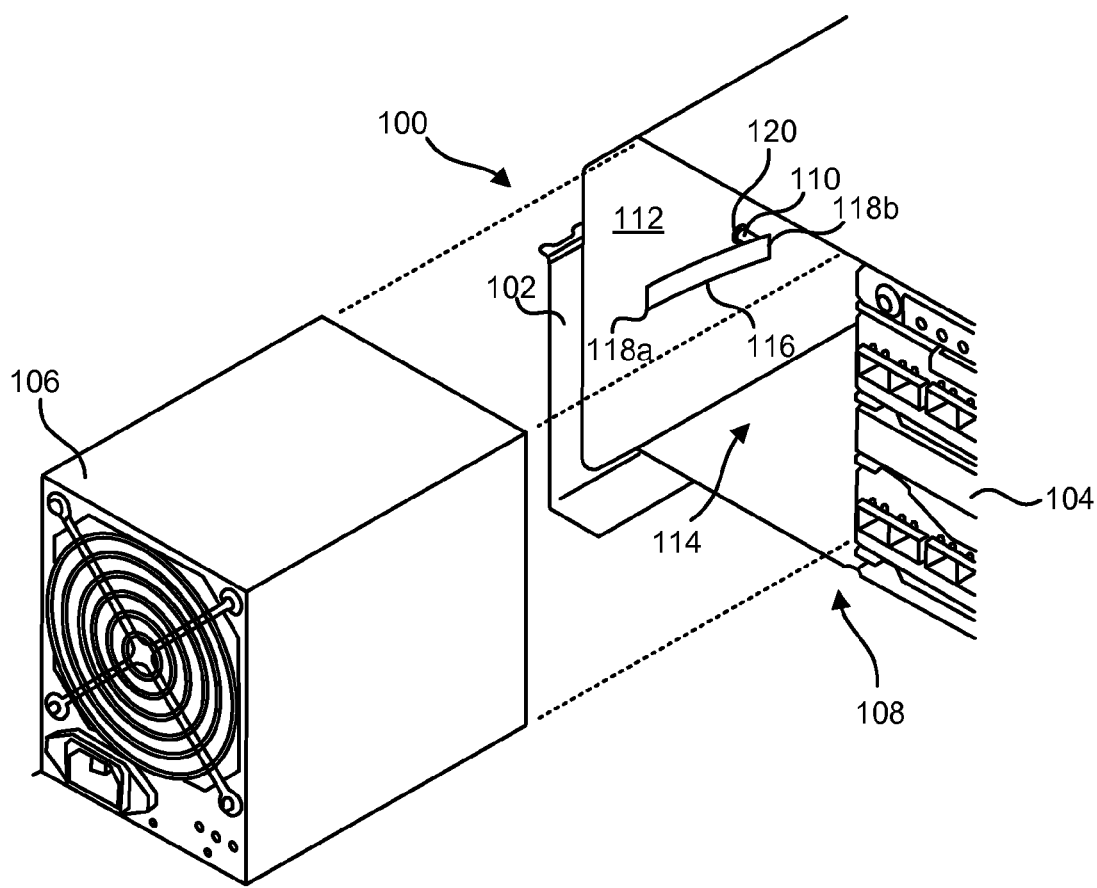
FIG. 1A is a perspective view of a chassis having a chassis attachment device incorporated therein in accordance with certain embodiments of the present invention.
Figure 1B:
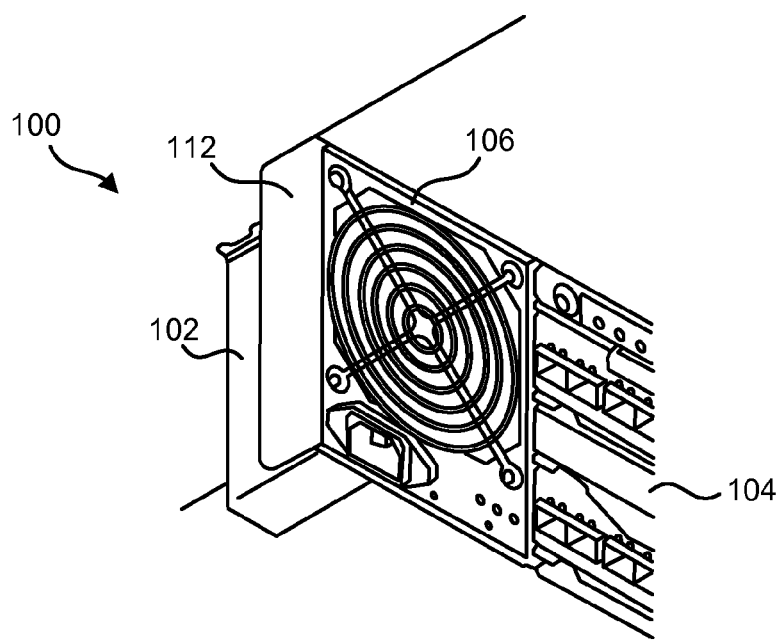
FIG. 1B is a perspective view of the chassis of FIG. 1A, where the power supply has been installed to automatically actuate the chassis attachment device incorporated therein.

Referring now to FIGS. 1A and 1B, embodiments of the present invention may be implemented to tie down a chassis 108 to a rackmount rail 102 in a standard rack assembly 100. Particularly, the present invention may automatically secure the chassis 108 to the rackmount rail 102 upon insertion of one or more electronic components 104 into the chassis 108.

A rack assembly 100 may be generally defined by vertically disposed mounting strips (not shown) providing vertical support to the rack 100, and horizontally disposed rackmount rails 102 attached thereto. Rackmount rails 102 may comprise stationary rails, shelves, extendable slides, or any other device known to those in the art capable of supporting electronic equipment within the rack 100. The rack assembly 100 may yield dimensions substantially conforming to the Electronic Industries Alliance ("EIA") standard to render the rack 100 highly modular and able to accommodate specific equipment and storage needs.

A chassis 108 housing electronic equipment components 104 may also yield dimensions substantially conforming to the EIA standard, thereby maximizing flexibility of use within the rack 100. The chassis 108 may be inserted into the rack 100 and supported by one or more rackmount rails 102. In some embodiments, a bolt or other fastener (not shown) known to those in the art may be implemented to secure the installed chassis 108 to the vertical mounting strip.

As shown in FIG. 1A, the chassis 108 may house electronic components 104 including, for example, telecommunications equipment and/or computer system components such as data storage devices, servers, printers, displays, computer networking nodes, and the like. In certain embodiments, the chassis 108 may further house a Customer Replaceable Unit ("CRU") 106 such as a power supply, CD/ROM, floppy drive, memory, fan, switch box, or any other easily replaceable component known to those in the art.

In certain embodiments of the present invention, the chassis 108 may include a substantially elongate pin 110 operably attached to a wall 112 thereof. The pin 110 may engage an aperture (not shown) disposed within the rackmount rail 102 to automatically secure the chassis 108 to the rackmount rail 102, as discussed in more detail with reference to FIGS. 2A and 2B below. The pin 110 may be substantially cylindrical, or may comprise any cross-sectional shape known to those in the art.

In certain embodiments, a spring or other biasing member 116 may operably attach the pin 110 to the chassis 108. The biasing member 116 may be pre-loaded to maintain the pin 110 at a position distanced from the wall 112 absent an application of force thereto. Alternatively, the biasing member 116 may maintain the pin 110 at a position substantially corresponding to the wall 112. In one embodiment the wall 16 may include an access aperture 120 adapted to accommodate the pin 110. The biasing member 116 may maintain the pin 110 at a position wherein the pin 110 at least partially penetrates the access aperture 120.

In one embodiment, the biasing member 116 comprises a substantially elongate, spring-form steel material. One skilled in the art will recognize, of course, that the biasing member 116 may comprise any substantially resilient material adapted to retain the pin 110 in a position substantially perpendicular to the wall 112 of the chassis 108. The biasing member 116 may exhibit a substantially slim profile such that an application of force may substantially align the biasing member 116 with the wall 112 and thereby minimize interference with surrounding architecture.

In certain embodiments, one end 118a of the biasing member 116 may be attached to an inside surface of the wall 116 such that the opposite end 118b is biased substantially away from the wall 112. The pin 110 may extend substantially perpendicularly from the end 118b of the biasing member 116. In this manner, the biasing member 116 may retain the pin 110 in a position substantially perpendicular to the wall 112 of the chassis 108.

An application of force to the biasing member 116 may force the pin 110 to protrude from the chassis 108 and engage an aperture (not shown) in the rackmount rail 102, as discussed in more detail below with reference to FIGS. 2A and 2B. In some embodiments, a CRU 106 may be inserted into a channel 114 within the chassis 108 such that the CRU 106 exerts a substantially lateral force upon the biasing member 116. As previously mentioned, an access aperture 120 disposed in the wall 112 may permit the pin 110 to protrude therethrough. The pin 110 may then engage a corresponding aperture (not shown) disposed in the rackmount rail 102 to tie down the chassis 108. In this manner, embodiments of the present invention automate chassis 108 tie-down while obviating the need for tie-down screws or other fasteners that may be difficult to handle and/or may obstruct access to electronic components 104.

Figure 2A:
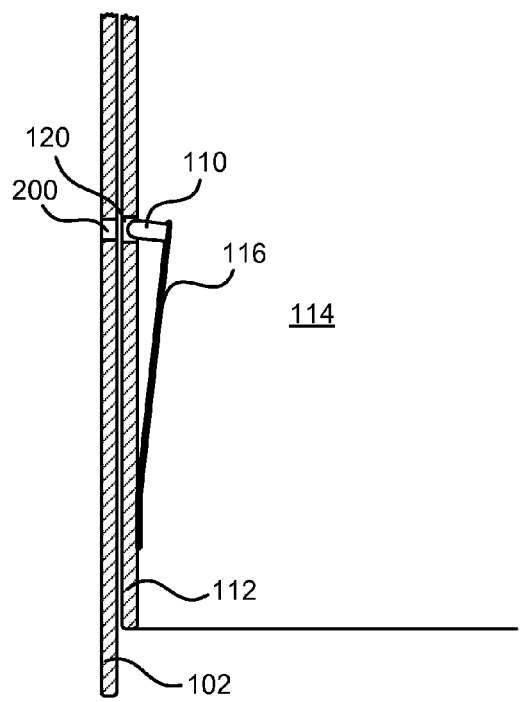
FIG. 2A is a top cross-sectional view of the chassis attachment device of FIG. 1A.
Figure 2B:
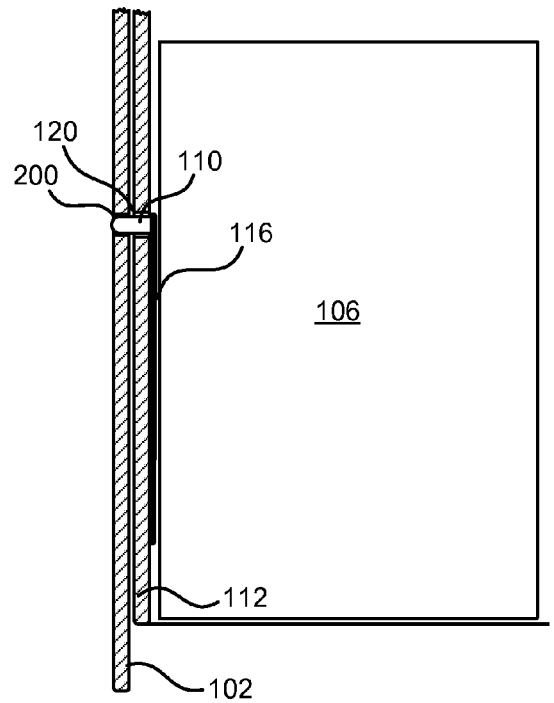
FIG. 2B is a top cross-sectional view of the actuated chassis attachment device of FIG. 2B.

Referring now to FIGS. 2A and 2B, an aperture 200 disposed in the rackmount rail 102 may substantially mirror the cross-sectional shape of the pin 110. Alternatively, the aperture 202 may comprise any shape known to those in the art having dimensions adapted to accommodate the pin 110. In certain embodiments, more than one aperture 202 may be integrated into the rail 102 to receive one or more pins 110. Likewise, an aperture 202 may be disposed within more than one rail 102 to receive a pin 110 in accordance with the present invention.

The pin 110 may automatically engage and disengage the aperture 202, thereby automatically securing and releasing the chassis 108 to and from the rail 102, depending on an application of force to the biasing member 120. As previously discussed, the biasing member 120 may be disposed within a substantially tight channel 114 adapted to receive a CRU 106. Accordingly, insertion of the CRU 106 into the channel 114 may effectively actuate the pin 110 to engage the aperture 200, while removal of the CRU 106 from the channel 114 may cause a substantially concurrent disengagement of the pin 100 from the aperture 200.

Specifically, the force applied to the biasing member 116 by the CRU 106 may result in potential energy being stored by the biasing member 116. This potential energy may remain stored so long as the CRU 106 remains in place. When the CRU 106 is removed, the potential energy may be released and the biasing member 116 may spring back to its original position, thereby disengaging the pin 110 from the aperture 114.

Advantageously, implementation of the present invention may not be apparent to a user. As operational components may reside within an interior channel 202 of the chassis 108, the present invention may go largely unnoticed. Further, actuation of the present invention to secure and release the chassis 108 to and from the rackmount rail 102 may not require any particular effort on the part of the user beyond that ordinarily required to install electronic components 104 within the chassis 108. The present invention thus enables effective tie-down of sensitive electronic equipment without inconveniencing a user.

Indeed, insertion of a CRU 106 into a chassis 108 ordinarily must be delayed until the chassis 108 has been initially placed onto the rackmount rails 102, as the combined weight of the chassis 108 and all internal components 104 including the CRU 106 may be prohibitive. In certain embodiments, however, it may be necessary to instruct the user to delay insertion of the CRU 106 or other actuating component 104 until the chassis 108 has been initially placed on the rails 102.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus to automatically secure a chassis to a rackmount rail, the apparatus comprising:
    a pin to protrude from a chassis upon inserting a component into the chassis; and
    an aperture disposed within a rackmount rail to automatically receive the pin and secure the chassis.

2. The apparatus of claim 1, further comprising a biasing member operably attaching the pin to the chassis.

3. The apparatus of claim 1, further comprising an access aperture disposed within the chassis, wherein the pin automatically protrudes through the access aperture upon inserting the component into the chassis.

4. A method to automatically secure a chassis to a rackmount rail, the method comprising:
    operably attaching a pin to a chassis, wherein the pin automatically protrudes from the chassis upon inserting a component into the chassis; and
    disposing within a rackmount rail an aperture to receive the pin and secure the chassis.

5. The method of claim 4, further comprising providing a biasing member to operably attach the pin to the chassis.

6. The method of claim 4, further comprising integrating within the chassis an access aperture, wherein the pin automatically protrudes through the access aperture upon inserting the component into the chassis.

* * * * *